United States Patent [19]

Schevey et al.

[11] 3,871,929

[45] Mar. 18, 1975

[54] POLYMERIC ETCH RESIST STRIPPERS AND METHOD OF USING SAME

[75] Inventors: William R. Schevey, Hawley, Pa.; Frank J. Kremers, Jordan, N.Y.

[73] Assignee: Allied Chemical Corporation, New York, N.Y.

[22] Filed: Jan. 30, 1974

[21] Appl. No.: 438,127

[52] U.S. Cl. .......................... 156/2, 96/36.2, 134/3, 156/8, 252/79.1

[51] Int. Cl. .......................... C23g 1/02, C09k 3/00

[58] Field of Search ......... 252/79.1, 79.4, 143, 171; 96/36, 36.2; 134/3, 38, 39; 156/2, 3, 8

[56] References Cited

UNITED STATES PATENTS

| | | | |
|---|---|---|---|
| 3,582,401 | 6/1971 | Berilla et al. | 134/3 |
| 3,813,309 | 5/1974 | Bakos et al. | 156/2 |

*Primary Examiner*—William A. Powell
*Attorney, Agent, or Firm*—Jay P. Friedenson; Michael L. Dunn

[57] ABSTRACT

Strippers for removal of organic films and deposits, such as polymeric etch resists employed in the manufacture of semiconductors and microcircuits, comprising a surface active agent, phenol or acetic acid, phenol sulfonic acid and chlorinated hydrocarbon.

17 Claims, No Drawings

POLYMERIC ETCH RESIST STRIPPERS AND METHOD OF USING SAME

BACKGROUND

During manufacture of semiconductors and semiconductor microcircuits, it is frequently necessary to coat the materials from which the semiconductors and microcircuits are manufactured with a polymeric organic substance which is generally a photoresist, i.e. a substance which forms an etch resist upon exposure to light. Subsequently, the polymeric organic substance must be removed. There is therefore a need for a stripping agent which will remove the organic substance from the coated material.

Prior art products for removal of organic substances frequently contained a strong oxidizing agent such as chromic acid. Unless the concentration and exposure of the oxidizing agent to the coated material was strictly controlled the acid-containing stripping agent would attack the material to which the organic substance was applied. Organic strippers for removing polymeric organic substances from materials used in the manufacture of semiconductors and microcircuits are therefore preferred. Prior to this invention a suitable organic stripping agent for removal of the organic substance was not available in that previous organic stripping agents formed insoluble precipitates upon exposure to air, did not strip the organic substance with the speed desired, had undesirable color, contained a large number of components, frequently corroded aluminum materials, and were not sufficiently compatible with both organic solvents and water for use in general application. The prior art organic stripping agents are therefore unsuitable for use in automated process equipment.

BRIEF DESCRIPTION OF THE INVENTION

A class of compositions useful for removing organic polymeric deposits from the surface of materials used in the manufacture of semiconductors and microcircuits have now been discovered. The compositions are suitable for the above described stripping operations without attacking or damaging the numerous inorganic materials which may be encountered in such stripping operations in the electrical and electronics industry. The stripping compositions of the invention do not cause etching, peeling or other visible degradation of these inorganic materials even after 5 to 10 cycles of coating and removing of polymeric organic substances, e.g. etch resists, and do not affect the electrical resistivity or conductivity of the materials. In addition, the compositions of this invention do not form insoluble precipitates upon standing in air, will strip photoresists in less time than was previously possible using prior art organic stripping compositions, have less undesirable color, contain fewer components than required in prior art organic stripping compositions, do not corrode aluminum materials, have improved miscibility in organic solvents and in water and are suitable for use in automated process equipment. The strippers of the invention comprise from about 25 to about 35 percent phenol or acetic acid, from about 10 to about 25 percent phenol sulfonic acid, from about 15 to about 30 percent of a chlorinated hydrocarbon boiling between about 120° to about 210°C. such as ortho dichlorobenzene, and from about 20 to about 35 percent of a suitable surface active agent which has an HLB number between about 11.0 and 12.5. In accordance with the method of the present invention a material coated with a polymeric organic substance, e.g. a photoresist, is sprayed with or immersed in a solution of the above formulation. The polymeric organic substance then dissolves in the solution and is washed from the surface of the coated material with any suitable wash liquid such as water, perchloroethylene or trichloroethylene.

DETAILED DESCRIPTION OF THE INVENTION

In accordance with this invention there is provided a stripper for polymeric organic substances which stripper comprises from about 25 to 35 weight percent phenol or acetic acid, from about 10 to about 30 weight percent phenol sulfonic acid, from about 15 to about 30 weight percent of a chlorinated hydrocarbon boiling between about 120° to about 210°C. and from about 25 to 35 weight percent of a suitable surface active agent having a hydrophile-lipophile balance (HLB) number of between about 11.0 and about 12.5.

The surface active agent is preferably strongly anionic although it may be non-ionic provided there is a highly hydrophilic chain such as a polyol chain in the structure. Preferred surface active agents are alkyl or aryl sulfonates having an alkyl hydrophobic chain. The most preferred surface active agents are alkyl aryl sulfonates wherein the average alkyl chain length is between about 10 and about 14 carbon atoms and the aryl group is benzene, toluene or xylene. In accordance with this invention linear dodecylbenzenesulfonic acid has been found to be the most preferred surface active agent.

The phenol or acetic acid in the stripper formulation appears to act in conjunction with the other components to dissolve and lift the polymeric organic substance from a substrate coated with the substance. The preferred compound for obtaining the best results seems to be phenol since a better dissolving and lifting action is obtained.

The phenol sulfonic acid similarly seems to act to dissolve and lift the polymeric organic substance and it has been found that when from about 15 to about 25 percent by weight of stripper of phenol sulfonic acid is used substantially faster stripping action occurs, more water can be tolerated in the stripper with less corrosion of aluminum substrates than was previously possible with prior art strippers and fewer undesirable precipitates result upon exposure of the stripper to air.

The chlorinated hydrocarbon assists in dissolving and diluting the organic substance and may for example be selected from metadichlorobenzene, orthodichlorobenzene, trichlorobenzene, chlorinated toluenes, perchloroethylene and mixtures of any of these chlorinated hydrocarbons. A particularly effective chlorinated hydrocarbon has been found to be orthodichlorobenzene. The preferred chlorinated hydrocarbons boil between about 120° to about 210°C. and preferably between about 150° to 190°C.

The polymeric organic substances which are to be removed by the strippers of this invention are usually photoresists which generally comprise polymers selected from low molecular weight polyisoprenes, polyvinyl cinnamiates and phenol-formaldehyde resins. These photoresists are applied to a substrate, e.g. aluminum, portions are masked and the entire portion is then exposed to light e.g. a 120 volt 650 watt quartz lamp for 1 to 15 seconds at a distance of 6–12 inches to further polymerize the exposed photoresists. The portion of the photoresist which is not exposed, i.e. masked from the light, is then removed by a mild solvent which does not dissolve the exposed photoresist thus leaving a pattern such as an electrical circuit pattern, on the exposed substrate. The remaining photoresist is then baked for further hardening and the portion of the substrate which is not covered by the photoresist is then etched or otherwise treated. The hardened photoresist must then be removed.

In using the stripper of this invention, the substrate covered by the photoresist is contacted with the stripper of this invention at a temperature of from about 50° to about 180°C. The preferred temperature is from about 90° to about 120°C. since a 90 degree temperature results in faster stripping time and since temperatures above 120°C. permit losses of stripper by evaporation at a rate which is not desirable. Times required for stripping of the photoresist are from about 1 to about 15 minutes at from about 90° to about 120°C.

After stripping the substrate is rinsed in any suitable liquid. Examples of suitable rinsing liquids are: ethanol, isopropyl alcohol, trichloroethylene and mixtures of 1,1,2-trichloro 1,2,2-trifluroethane with alcohols containing 1–3 carbon atoms.

The following examples serve to illustrate the stripper formulations and stripping method of this invention. In each example all parts and percentages are by weight. Three different stripper formulations are used in the following examples. Formulation A is a prior art organic stripper, Formulation B is a first embodiment of the stripper of this invention and Formulation C is a second embodiment of the stripper of this invention. The formulations are as follows:

Formulation A

| | |
|---|---|
| Linear dodecylbenzenesulfonic acid | 28% |
| Phenol | 28% |
| Toluene sulfonic acid | 18% |
| Orthodichlorobenzene | 18% |
| Perchloroethylene | 8% |

Formulation B

| | |
|---|---|
| Linear dodecylbenzenesulfonic acid | 30% |
| Phenol | 30% |
| Phenol sulfonic acid | 20% |
| Orthodichlorobenzene | 20% |

Formulation C

| | |
|---|---|
| Linear dodecylbenzenesulfonic acid | 28.0% |
| Phenol | 28.0% |
| Phenolsulfonic acid | 18.5% |
| Orthodichlorobenzene | 18.5% |
| Perchloroethylene | 7.0% |

EXAMPLE 1

100 ml of formulations A, B and C are placed in separate 250 ml beakers open to the atmosphere at 20°C. and 80 percent relative humidity. After twenty-four hours formulation A becomes cloudy and contains undesirable precipitate whereas formulations B and C remain clear indicating that formulations B and C of the invention less readily form undesirable precipitates when contacted with air than prior art formulation A.

EXAMPLE 2

Three silicon wafers are coated with polyisoprene photoresist. The photoresist coating is then exposed to a 120 volt 650 watt quartz lamp for 15 seconds at a distance of 12 inches. The photoresist coating is then baked at 240°C. for 2 hours. Each wafer is then immersed in one of formulations A, B and C at a temperature of 100°C. and the times required for stripping the photoresist from the wafer are measured. The results are set forth in Table I. The results indicate that formulations B and C of this invention permit faster stripping times than prior art formulation A.

Table I

| Formulation | Stripping Time |
|---|---|
| A | 30 minutes |
| B | 8 minutes |
| C | 8 minutes |

EXAMPLE 3

After stripping, each of the wafers used in Example 2 are rinsed with a non-flammable mixture of 83 weight percent of 1,1,2-trichloro 1,2,2-trifluoroethanol and 7 weight percent isopropanol. All of formulations B and C are removed by the rinse; whereas, formulation A is immiscible with the mixture and is not removed by the rinse. This example indicates that formulations B and C of this invention are more readily removed by rinsing liquids containing halogenated hydrocarbons than the prior art formulation.

We claim:

1. A stripper for polymeric organic substances which stripper comprises from about 25 to about 35 weight percent phenol or acetic acid, from about 10 to about 30 weight percent phenol sulfonic acid, from about 15 to about 30 weight percent of a chlorinated hydrocarbon which boils between about 120 to about 210° Centigrade, from about 25 to 35 weight percent of a suitable surface active agent having a HLB number of between about 11.0 and 12.5.

2. The stripper of claim 1 wherein the polymeric organic substance is a photoresist which comprises a polymer selected from polyisoprene, polyvinyl cinamiate, and phenol-formaldehyde resins.

3. The stripper of claim 1 wherein the stripper comprises from about about 25 to about 35 weight percent phenol.

4. The stripper of claim 3 wherein the surface active agent is anionic.

5. The stripper of claim 4 wherein the surface active agent is an alkylarylsulfonate.

6. The stripper of claim 5 wherein the alkyl group in the alkylarylsulfonate has an average chain length between about 10 and about 14 carbon atoms.

7. The stripper of claim 6 wherein the surface active agent is linear dodecylbenzenesulfonic acid.

8. The stripper of claim 6 wherein the chlorinated hydrocarbon has a boiling point between about 150° to 190°C.

9. The stripper of claim 8 wherein the chlorinated hydrocarbon is dichlorobenzene.

10. The stripper of claim 8 wherein the chlorinated hydrocarbon is a mixture of orthodichlorobenzene and perchloroethylene.

11. A method of stripping a polymeric organic substance from a substrate comprising contacting the polymeric organic substance with the stripper of claim 1 at a temperature of from about 50° to about 180°C.

12. The method according to claim 11 wherein said polymeric organic substance is a photoresist which comprises a polymer selected from polyisoprene, polyvinyl cinnamiate and phenol-formaldehyde resins.

13. The method according to claim 12 wherein the stripper comprises from about 25 to about 35 weight percent phenol.

14. The method according to claim 13 wherein the temperature is between about 90° to 120° C.

15. The method according to claim 14 wherein the surface active agent is an alkylarylsulfonate wherein the alkyl group has an average chain length between about 10 and about 14 carbon atoms.

16. The method according to claim 15 wherein the surface active agent is linear dodecylbenzenesulfonic acid.

17. The method according to claim 16 wherein the chlorinated hydrocarbon is dichlorobenzene.

* * * * *